(12) United States Patent
Sakurai et al.

(10) Patent No.: US 7,096,548 B2
(45) Date of Patent: Aug. 29, 2006

(54) MANUFACTURING METHOD OF INTEGRATED CAPACITOR

(75) Inventors: Hiroki Sakurai, Yokohama (JP); Hiroshi Tomita, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 230 days.

(21) Appl. No.: 10/823,541

(22) Filed: Apr. 14, 2004

(65) Prior Publication Data

US 2005/0146834 A1 Jul. 7, 2005

(30) Foreign Application Priority Data

Jan. 5, 2004 (JP) ............................ P2004-000655

(51) Int. Cl.
*H01G 7/00* (2006.01)
*H01L 21/8234* (2006.01)

(52) U.S. Cl. .................... 29/25.41; 29/25.42; 29/25.35; 29/852; 29/846; 438/238

(58) Field of Classification Search ............... 29/25.41, 29/571, 578, 25.42, 25.35, 852, 846; 438/238, 438/381, 240, 253, 243; 361/302, 93.7, 306.3, 361/306.2, 306.1; 216/80, 76, 77
See application file for complete search history.

(56) References Cited

U.S. PATENT DOCUMENTS

| | | | | |
|---|---|---|---|---|
| 4,645,564 A | * | 2/1987 | Morie et al. ................. | 438/388 |
| 4,922,313 A | * | 5/1990 | Tsuchiya ..................... | 257/301 |
| 5,432,113 A | * | 7/1995 | Tani ........................... | 438/386 |
| 5,843,819 A | * | 12/1998 | Kellner et al. .............. | 438/243 |

FOREIGN PATENT DOCUMENTS

| JP | 2003-234325 | 8/2003 |
|---|---|---|
| JP | 2003-282734 | 10/2003 |

OTHER PUBLICATIONS

Lee, J. H. et al., "Mass Production Worthy $HfO_2$—$Al_2O_3$ Laminate Capacitor Technology Using Hf Liquid Precursor for Sub-100nm DRAMs", IEEE, 4 pages, (2002).
Gutsche, M. et al., "Capacitance Enhancement Techniques for Sub-100nm Trench DRAMs", IEEE, 4 pages, (2001).
Seidl, H. et al., "A Fully Integrated $Al_2O_3$ Trench Capacitor DRAM for Sub-100nm Technology", IEEE, 4 pages, (2002).

* cited by examiner

*Primary Examiner*—A. Dexter Tugbang
*Assistant Examiner*—Tai Van Nguyen
(74) *Attorney, Agent, or Firm*—Finnegan, Henderson, Farabow, Garrett & Dunner, L.L.P.

(57) ABSTRACT

Disclosed is a manufacturing method of an integrated capacitor including: forming a hole in a semiconductor substrate; depositing a dielectric film on an inner face of the formed hole; heat-treating the deposited dielectric film; depositing a silicon film on the dielectric film; embedding a resist film in the hole except an upper portion of the inner face of the hole on which the dielectric film and the silicon film are deposited; etching the silicon film on the heat-treated dielectric film with the embedded resist film as a mask; removing the resist film; removing the heat-treated dielectric film by etching with the silicon film remaining after the etching as a mask; and embedding an electrode material in the hole having the dielectric film remaining after the removal by etching, and the integrated capacitor.

16 Claims, 15 Drawing Sheets

FIG. 1A1
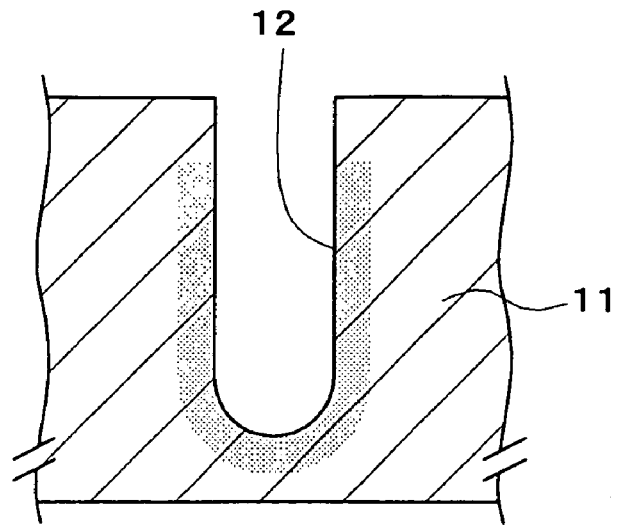
FIG. 1A2
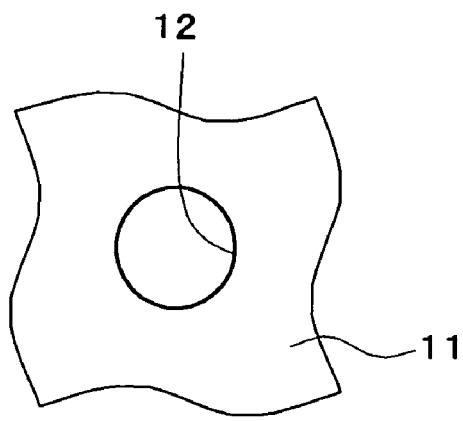

FIG. 6A1
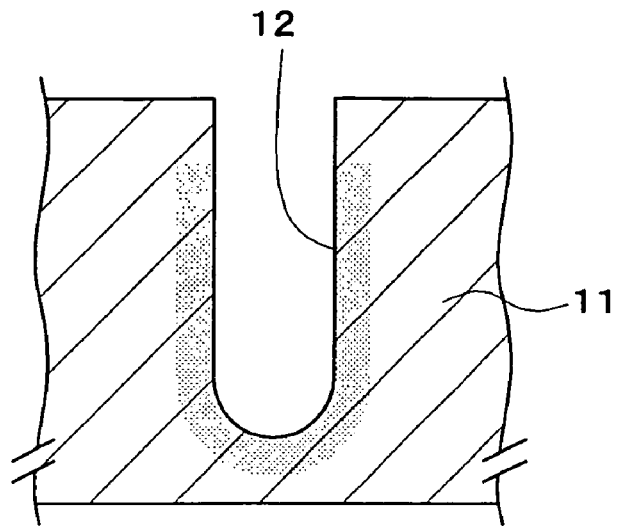
FIG. 6A2
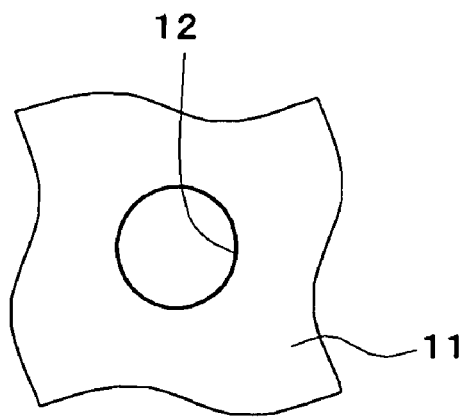

MANUFACTURING METHOD OF INTEGRATED CAPACITOR

CROSS REFERENCE TO RELATED APPLICATIONS

This application is based upon and claims the benefit of priority from the prior Japanese Patent Application No. 2004-000655, filed on Jan. 5, 2004; the entire contents of which are incorporated herein by reference.

BACKGROUND

1. Field of the Invention

The present invention relates to a manufacturing method of an integrated capacitor to be integrated into a semiconductor device and such an integrated capacitor, more particularly, to a manufacturing method of an integrated capacitor having a high dielectric constant capacitor insulating film and the integrated capacitor.

2. Description of the Related Art

A semiconductor memory such as a DRAM which is an integrated circuit requires, as an integrated element, a capacitor (electrostatic capacitance element) for the accumulation of charge in addition to a transistor. With an increase in memory size from 256 Mb to 512 Mb and further to a gigabit-class memory size, an improvement in the degree of integration of elements is inevitably demanded. To improve the degree of integration, an integrated capacitor having a structure (trench capacitor) in which a hole is formed in a semiconductor substrate, a capacitor insulating film is formed on an inner face of the hole, and an electrode material is embedded in the hole is already used. The capacitor thus structured is described, for example, in Japanese Patent Laid-open Application No. 2003-282734 (Patent Document 1). According to this, it is possible to form a higher electrostatic capacitance capacitor with smaller dimensions as a plan view.

To enable the trench capacitor to cope with higher integration, measures to reduce an area in the plan view and secure an electrostatic capacitance as the capacitor are needed. As one of these measures, it is conceivable to use a high dielectric constant film as the capacitor insulating film. In this case, a point to consider is how the high dielectric constant film is formed at high quality in a desired region. The high dielectric constant film has a different property from a low dielectric constant film (such as silicon oxide), whereby a processing (etching) method different from a conventional one is needed. Incidentally, etching of a material which serves as the high dielectric constant film is described, for example, in Japanese Patent Laid-open Application No. 2003-234325 (Patent Document 2).

[Patent Document 1] JP-A 2003-282734

[Patent Document 2] JP-A 2003-234325

A point to notice when a high dielectric constant film is used as a capacitor insulating film is a reduction in leakage current. This is because, if the leakage current is large, a basic characteristic as a capacitor cannot be secured. It is understood here that to reduce the leakage current, it is useful that a high dielectric constant material is heat-treated and crystallized. However, the crystallized high dielectric constant film is very hard to etch in terms of processability. Accordingly, it is difficult to manufacture an integrated capacitor with a trench structure using the high dielectric constant film.

SUMMARY

A manufacturing method of an integrated capacitor according to an aspect of the present invention includes: forming a hole in a semiconductor substrate; depositing a dielectric film on an inner face of the formed hole; heat-treating the deposited dielectric film; depositing a silicon film on the dielectric film; embedding a resist film in the hole except an upper portion of the inner face of the hole on which the dielectric film and the silicon film are deposited; etching the silicon film on the heat-treated dielectric film with the embedded resist film as a mask; removing the resist film; removing the heat-treated dielectric film by etching with the silicon film remaining after the etching as a mask; and embedding an electrode material in the hole having the dielectric film remaining after the removal by etching.

A manufacturing method of an integrated capacitor according to another aspect of the present invention includes: forming a hole in a semiconductor substrate; depositing a dielectric film on an inner face of the formed hole; depositing a silicon film on the deposited dielectric film; embedding a resist film in the hole except an upper portion of the inner face of the hole on which the dielectric film and the silicon film are deposited; etching the silicon film on the deposited dielectric film with the embedded resist film as a mask; removing the resist film and removing the deposited dielectric film by etching with the silicon film remaining after the etching as a mask; heat-treating the dielectric film remaining after the removal by etching; and embedding an electrode material in the hole having the dielectric film remaining after the removal by etching.

An integrated capacitor according to an aspect of the present invention includes: a semiconductor substrate; a crystallized dielectric film which is formed on an inner face of a hole except an upper portion of the hole formed in the semiconductor substrate; and an electrode material which is embedded in the hole.

BRIEF DESCRIPTION OF THE DRAWINGS

Embodiments of the present invention will be described with reference to the drawings. These drawings are provided only for the illustrative purpose and in no respect, are intended to limit the present invention.

FIG. 1A1, FIG. 1A2, FIG. 1B, and FIG. 1C are process views showing a manufacturing method of an integrated capacitor according to an embodiment of the present invention in schematic longitudinal section (partly in top view).

FIG. 6A1, FIG. 6A2, FIG. 6B, and FIG. 6C are process views showing a manufacturing method of an integrated capacitor according to another embodiment of the present invention in schematic longitudinal section (partly in top view).

DETAILED DESCRIPTION (Explanation on Embodiments)

Figure 1B:
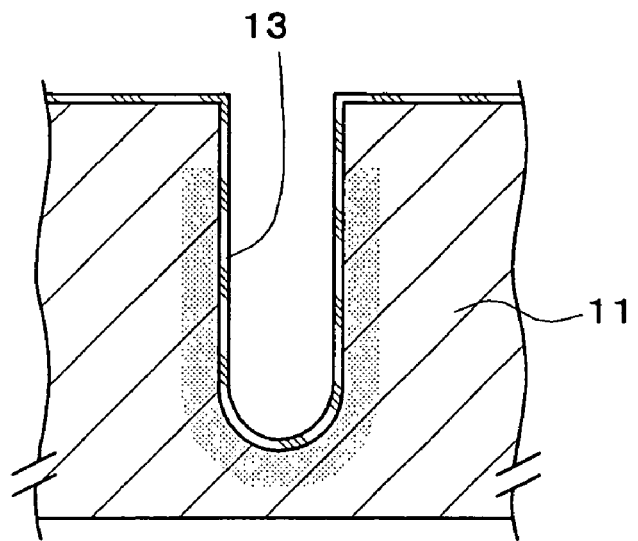

According to a manufacturing method of an integrated capacitor according to one aspect of the present invention, a dielectric film is subjected to heat treatment. The dielectric film is crystallized by the heat treatment to thereby form a high-quality film whose leakage current is reduced as a capacitor insulating film. Moreover, in the middle of manufacturing, a stacked structure of the heat-treated dielectric film, a silicon film, and a resist film is formed, and there films are respectively etched (or removed). Namely, these materials are selectively etched (removed) respectively. Consequently, the high-quality dielectric film can be formed in a desired region.

Here, as a form of the aspect, in the aforementioned step of depositing the silicon film on the dielectric film, a polycrystalline silicon film or an amorphous silicon film is deposited as the silicon film. The deposition of the silicon film may use either the polycrystalline silicon film or the amorphous silicon film.

As another form of the aspect, in the aforementioned step of embedding the resist film in a hole except an upper portion of an inner face of the hole on which the dielectric film and the silicon film are deposited, a novolak resin is used as the resist film, and in the aforementioned step of removing the resist film, the resist film is removed with a mixed solution of sulfuric acid and hydrogen peroxide aqueous solution. The novolak resin is one of the most common materials as the resist film, and if the mixed solution of sulfuric acid and hydrogen peroxide aqueous solution is used for removing the resist film after the resist film is used as a mask, this treatment is completed efficiently and easily. Note that the silicon film and the heat-treated dielectric film are not significantly etched by this chemical.

As still another form of the aspect, in the aforementioned step of depositing the dielectric film on the inner face of the formed hole, an $Al_2O_3$ film is used as the dielectric film and deposited by an ALD method. The $Al_2O_3$ film (alumina film) is typical as high dielectric constant films. If this $Al_2O_3$ film is deposited by the ALD (atomic layer deposition) method, the thinner $Al_2O_3$ film can be deposited with high precision on an inner face of a smaller hole, which is suitable for coping with high integration.

Here it is preferable that the aforementioned step of heat-treating the deposited dielectric film be performed at a temperature of 800° C. or higher. The solubility of the $Al_2O_3$ film which is the high dielectric constant film in the mixed solution of sulfuric acid and hydrogen peroxide aqueous solution can be reduced to almost zero by this heat treatment.

As yet another form of the aspect, in the aforementioned step of depositing the dielectric film on the inner face of the formed hole, a stacked film of the $Al_2O_3$ film and a dielectric film other than the $Al_2O_3$ film may be deposited as the dielectric film. As a result, a higher electrostatic capacitance capacitor can be formed. For example, the dielectric film other than the $Al_2O_3$ film can be a $HfO_2$ film (hafnia film).

In a manufacturing method of the integrated capacitor as yet another form of the aspect, the silicon film remaining after the etching may be left as part of the electrode material to be embedded in the hole. If the silicon film is left as part of the electrode material, it is unnecessary to remove the silicon film once, which can simplify the step, resulting in increased efficiency.

According to a manufacturing method of an integrated capacitor according to another aspect of the present invention, a dielectric film is subjected to heat treatment, but in a step prior thereto, a stacked structure of the dielectric film, a silicon film, and a resist film is formed, and the etching of the silicon film and the etching (or removal) of the dielectric film and the resist film are performed. Namely, the silicon film, and the dielectric film and the resist film are etched (removed) with selectivity. Consequently, the high-quality dielectric film can be formed in a desired region.

Here, as a form of the other aspect, in the aforementioned step of depositing the silicon film on the deposited dielectric film, a polycrystalline silicon film or an amorphous silicon film is deposited as the silicon film. The deposition of the silicon film may use either the polycrystalline silicon film or the amorphous silicon film.

As another form of the other aspect, in the aforementioned step of embedding the resist film in a hole except an upper portion of an inner face of the hole on which the dielectric film and the silicon film are deposited, a novolak resin is used as the resist film, and in the aforementioned step of removing the resist film and removing the deposited dielectric film by etching with the silicon film remaining after the etching as a mask, the resist film is removed with a mixed solution of sulfuric acid and hydrogen peroxide aqueous solution, and the deposited dielectric film is removed by etching with the silicon film remaining after the etching as the mask. The novolak resin is one of the most common materials as the resist film, and if the mixed solution of sulfuric acid and hydrogen peroxide aqueous solution is used for removing the resist film after the resist film is used as a mask, etching of the unnecessary dielectric film before the heat treatment is completed at the same time, which is efficient.

As still another form of the other aspect, in the aforementioned step of depositing the dielectric film on the inner face of the formed hole, an $Al_2O_3$ film is used as the dielectric film and deposited by an ALD method. This is the same as the aforementioned one aspect.

It is preferable here that the aforementioned step of heat-treating the dielectric film remaining after the removal by etching be performed at a temperature of 800° C. or higher. The solubility of the $Al_2O_3$ film which is the high dielectric constant film in the mixed solution of sulfuric acid and hydrogen peroxide aqueous solution is reduced to almost zero by this heat treatment. In other words, it is conceivable that crystallization progresses sufficiently and the high-quality dielectric film is formed with leakage current being suppressed.

As yet another form of the other aspect, in the aforementioned step of depositing the dielectric film on the inner face of the formed hole, a stacked film of the $Al_2O_3$ film and a dielectric film other than the $Al_2O_3$ film may be deposited as the dielectric film. For example, the dielectric film other than the $Al_2O_3$ film can be a $HfO_2$ film. This is the same as the aforementioned one aspect.

In a manufacturing method of the integrated capacitor as yet another form of the other aspect, the silicon film remaining after the etching may be left as part of the electrode material to be embedded in the hole. This is the same as the aforementioned one aspect.

Moreover, according to an integrated capacitor according to an aspect of the present invention, a dielectric film is crystallized, so that the integrated capacitor having a high dielectric constant high-quality capacitor insulating film can be provided. The crystallized dielectric film can have $Al_2O_3$ as its material. Typical of high dielectric constant films is an $Al_2O_3$ film. Further, the crystallized dielectric film can have $Al_2O_3$ and a dielectric other than $Al_2O_3$ as its materials. Consequently, a higher electrostatic capacitance capacitor can be formed. For example, the dielectric other than $Al_2O_3$ can be $HfO_2$.

Based on the above, embodiments of the present invention will be described below with reference to the drawings. FIG. 1A1 to FIG. 4 are process views showing a manufacturing method of an integrated capacitor according to an embodiment of the present invention in schematic longitudinal section (partly in top view). An explanation will be given below step by step.

First, as shown in FIG. 1A1 and FIG. 1A2, a hole 12 for forming a capacitor is formed in a silicon semiconductor substrate 11, for example, by an RIE (reactive ion etching) method. FIG. 1A1 is a longitudinal sectional view, and FIG. 1A2 is a top view. The size of the hole is, for example, approximately 0.2 µm in diameter and approximately 10 µm in depth. Note that after the formation of the hole 12, an n-type region is formed by diffusing, for example, arsenic (As) in a partial region (region shown by a dot pattern in the drawings) of the semiconductor substrate 11 facing an inner face of the hole 12 except an upper portion of the hole 12. This n-type region becomes one electrode of the capacitor. The formation of the n-type region will be mentioned later again.

Then, as shown in FIG. 1B, an $Al_2O_3$ film 13 being a high dielectric constant film which serves as a capacitor insulating film is deposited on the entire face including the inner face of the hole 12. If an ALD method is employed as a method for depositing the $Al_2O_3$ film 13, the $Al_2O_3$ film 13 whose film thickness is controlled to be very thin can be formed. As is commonly known, the ALD method is a method of growing a film layer by layer at atomic layer level with a source gas. The thickness obtained by more than one growth depends on a capacitance (for example, a few tens of fF) necessary as a capacitor, and for example, the thickness is approximately from 5 nm to 10 nm. Incidentally, from FIG. 1B, top views thereof are omitted since they are obvious.

Thereafter, in a state where the $Al_2O_3$ film 13 such as shown in FIG. 1B is deposited, the entire semiconductor substrate 11 is subjected to heat treatment (annealing) to crystallize the $Al_2O_3$ film 13 and reform it into a high-quality $Al_2O_3$ film 13a with little possibility of generation of leakage current. The heat treatment is performed, for example, at 800° for approximately 30 minutes. A temperature suitable for the heat treatment will be mentioned later again.

Figure 1C:
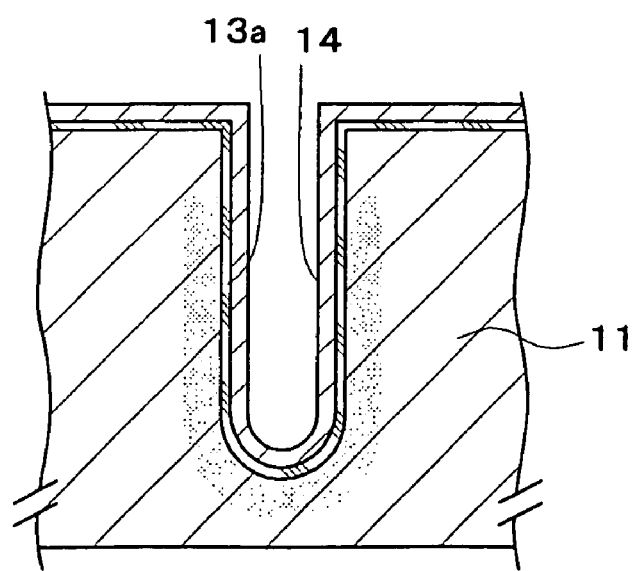

Subsequently, as shown in FIG. 1C, a silicon film 14 is deposited on the entire face of the $Al_2O_3$ film 13a, for example, by a CVD (chemical vapor deposition) method. The silicon film 14 may be either a polycrystalline silicon film or an amorphous silicon film. The silicon film 14 functions as an etching mask for the $Al_2O_3$ film 13a at least in an after-mentioned step. In some cases, after the silicon film 14 functions as the mask, the silicon film 14 may be used as part of the other electrode material of the capacitor. These respects will be described later. The silicon film 14 is formed, for example, with a thickness of approximately 50 nm.

Figure 2A:
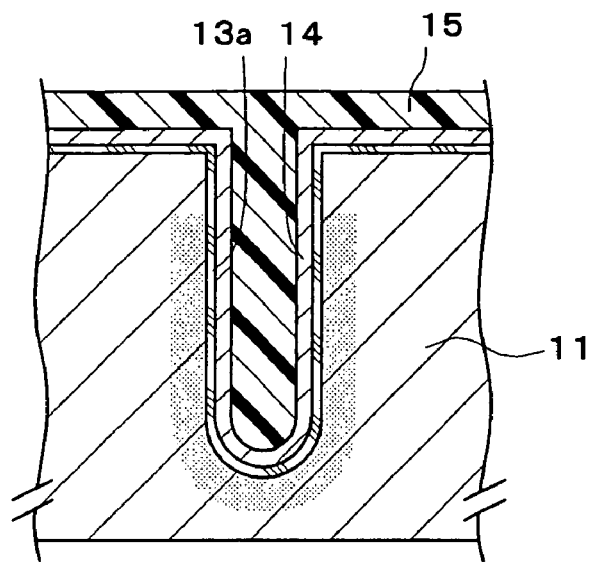
FIG. 2A, FIG. 2B, and FIG. 2C are process views subsequent to FIG. 1C, showing the manufacturing method of the integrated capacitor according to the embodiment of the present invention in schematic longitudinal section.

For patterning the silicon film 14 formed on the entire face as the etching mask for the $Al_2O_3$ film 13a, then, as shown in FIG. 2A, a resist film 15, for example, of a novolak resin is embedded in the hole on the silicon film 14 and applied on the entire face. By processing the formed resist film 15, the resist film 15 becomes a mask for patterning the silicon film 14.

Figure 2B:
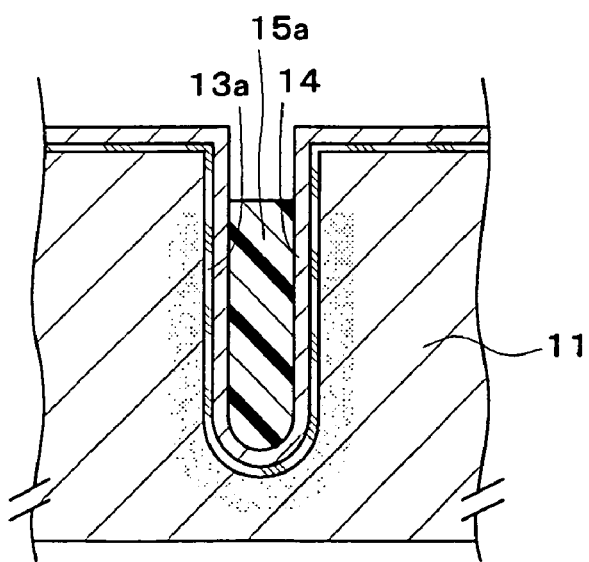

The resist film 15 is processed in such a manner that the entire face on the silicon film 14 higher than an extremely upper portion of the hole is removed as shown in FIG. 2B. Thereby, the resist film 15 becomes a resist film 15a which is shaped to be embedded in the hole on the silicon film 14 except the extremely upper portion thereof. Incidentally, the resist film 15 can be thus processed, for example, by a CDE (chemical dry etching) method. Moreover, an upper face of the resist film 15a is made lower than an upper face of the semiconductor substrate 11, for example, by approximately 1 µm.

Figure 2C:
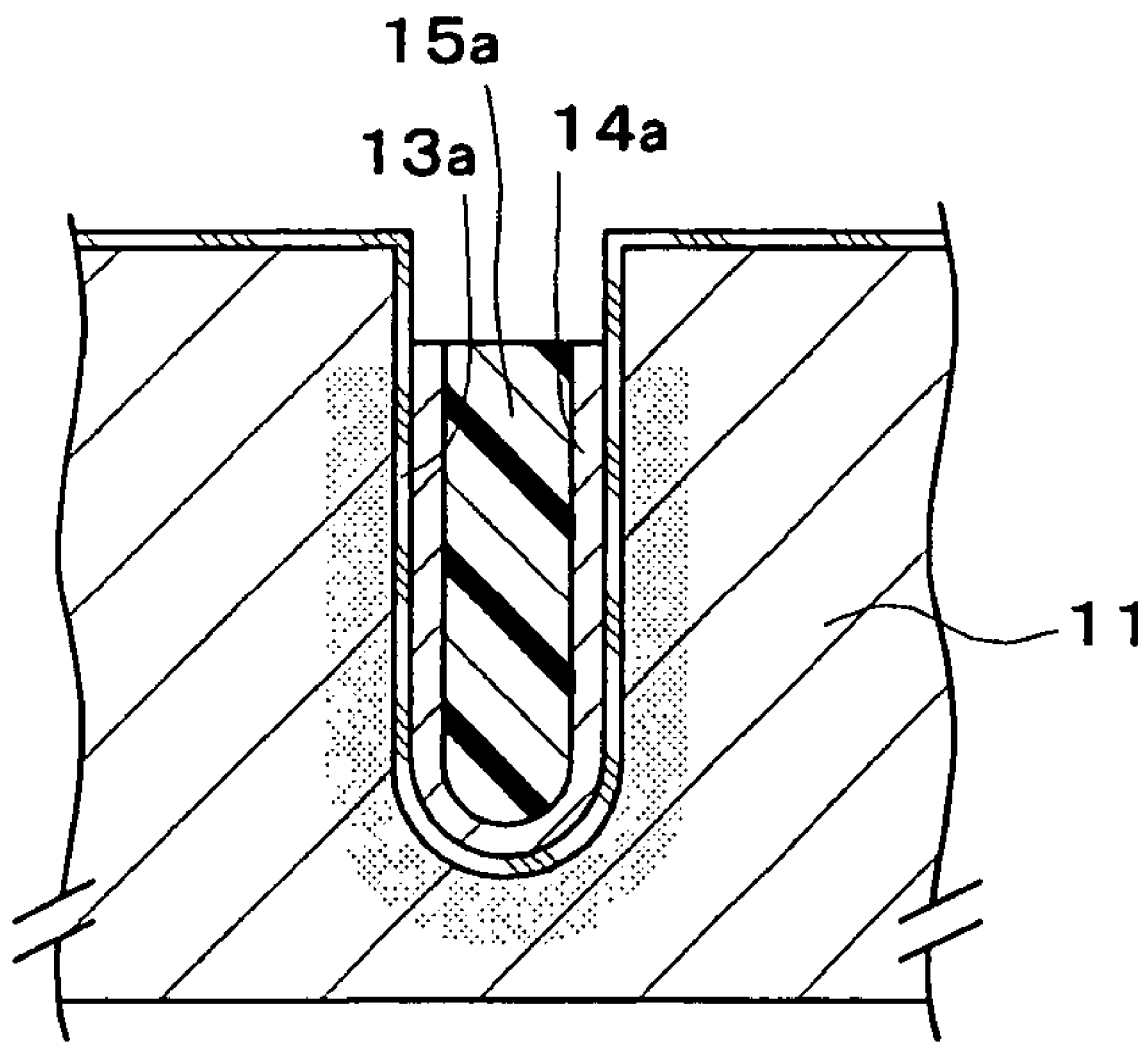
Figure 3A:
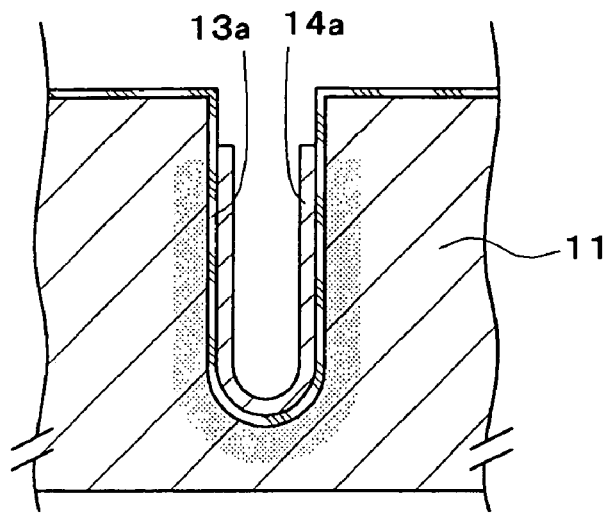
FIG. 3A, FIG. 3B, and FIG. 3C are process views subsequent to FIG. 2C, showing the manufacturing method of the integrated capacitor according to the embodiment of the present invention in schematic longitudinal section.

Thereafter, as shown in FIG. 2C, the silicon film 14 is patterned with the processed resist film 15a as a mask to leave a silicon film 14a. A CDE method, for example, can be used for such pattering (etching) of the silicon film 14. After the silicon film 14a is left, the resist film 15a is removed as shown in FIG. 3A. Wet etching, for example, for 15 minutes, for example, with a mixed solution of sulfuric acid (concentrated sulfuric acid) and hydrogen peroxide aqueous solution as a chemical is applicable to the removal of the resist film 15a. In this wet etching, the $Al_2O_3$ film 13a hardly dissolves since it is already heat-treated and crystallized.

Figure 3B:
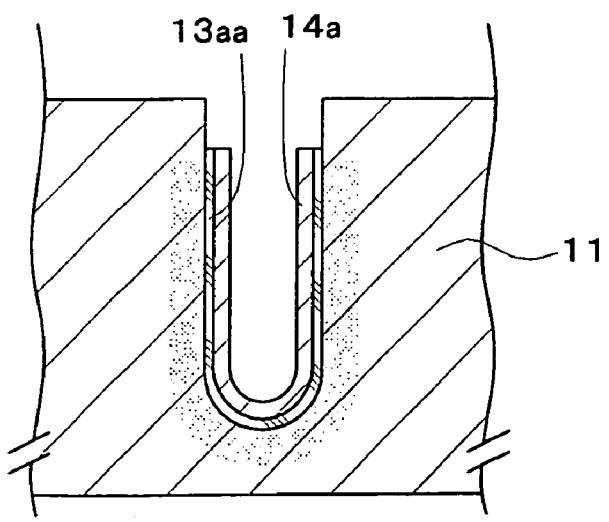

Then, as shown in FIG. 3B, the $Al_2O_3$ film 13a is removed by etching with the left silicon film 14a as a mask to leave an $Al_2O_3$ film 13aa. The heat-treated $Al_2O_3$ film 13a is a film which does not dissolve in most of chemicals and hence is difficult to etch as described above, but it can be removed by using heated phosphoric acid as a chemical for etching.

Figure 3C:
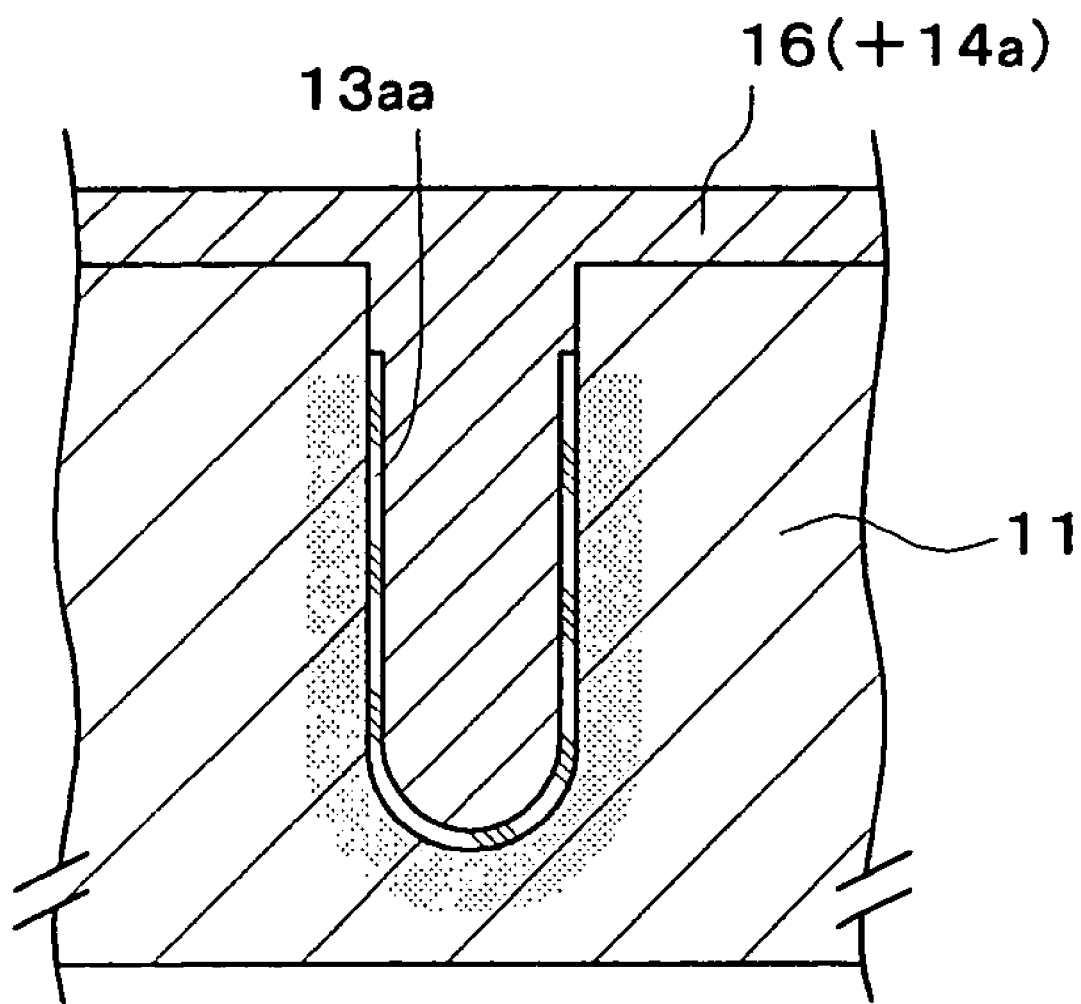

Thereafter, as shown in FIG. 3C, a silicon film 16 as an electrode material is formed to be embedded in the hole and formed on the entire face. The silicon film 16 is doped, for example, with As to become an n-type and conductive. Here, the silicon film 14a which has functioned as the mask may be removed, for example, by the CDE method from a state shown in FIG. 3B in advance. When the silicon film 14a is removed in advance, the step thereof is added, but it becomes unnecessary to dope the silicon film 14 with As and so on in the step of depositing the silicon film 14 (FIG. 1C). Incidentally, when the silicon film 14a is left and used as part of the electrode material, it is conceivable that by the preceding process, Al is diffused from the $Al_2O_3$ film 13a to thereby form a p-type semiconductor in the silicon film 14a. When the adverse effect thereof cannot be ignored, it is recommended to remove the silicon film 14a after the silicon film 14a functions as the mask.

Figure 4:
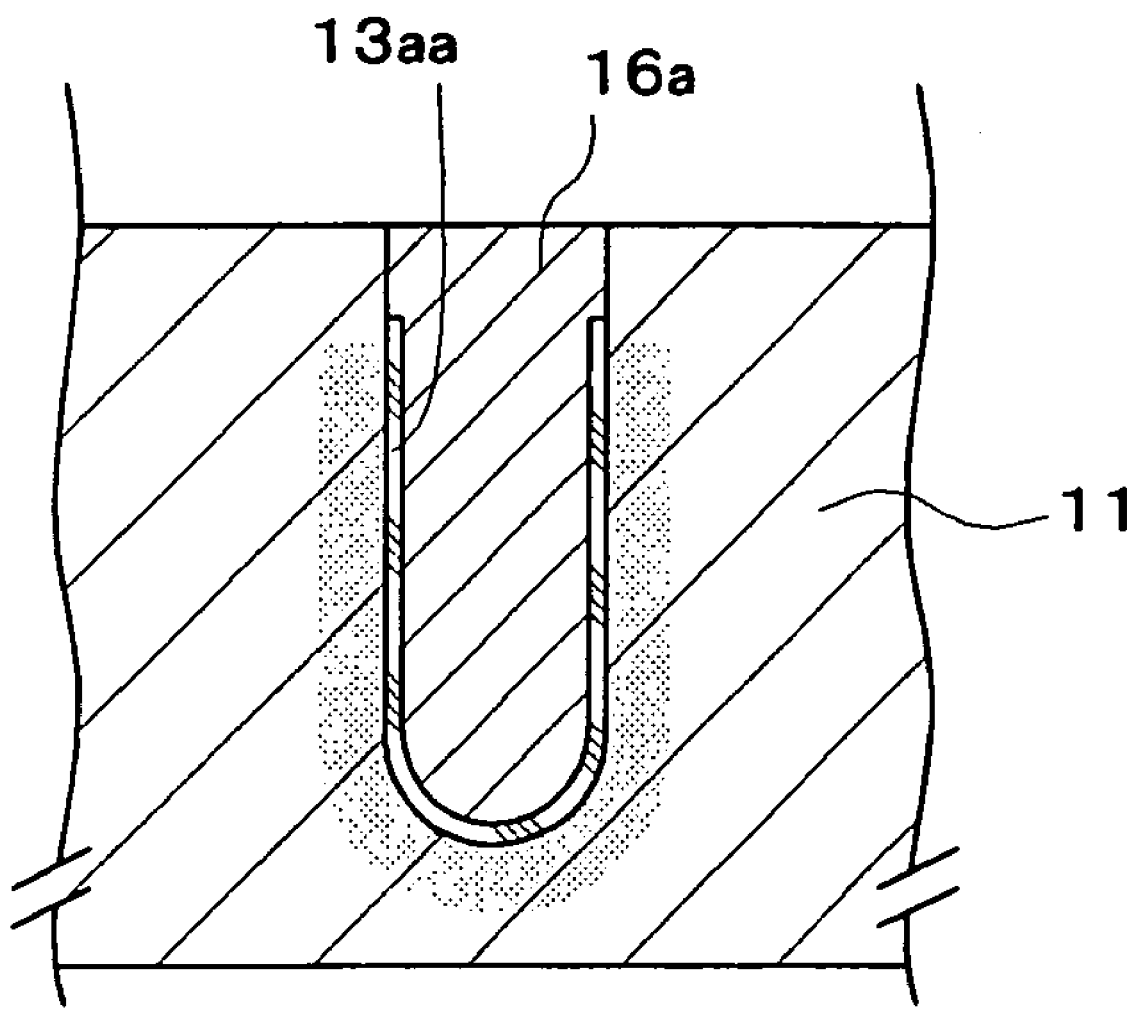
FIG. 4 is a process view subsequent to FIG. 3C, showing the manufacturing method of the integrated capacitor according to the embodiment of the present invention in schematic longitudinal section.

After the silicon film 16 is formed, as shown in FIG. 4, the silicon film 16 deposited/formed on the semiconductor substrate 11 is removed by polishing so as to leave a silicon film 16a as the electrode material only in the hole. As a result, a structure as the integrated capacitor can be obtained. As shown in FIG. 4, this structure is a structure in which the very thin $Al_2O_3$ film 13aa as the capacitor insulating film (dielectric film) exists between the n-type semiconductor region formed on the semiconductor substrate 11 side and the silicon film 16a as the electrode material.

Now, a supplementary explanation of the step of forming the n-type semiconductor region on the semiconductor substrate 11 side in advance (FIG. 1A1) will be given. This is performed in the following manner. After the hole 12 for the integrated capacitor is formed in the semiconductor substrate 11 as shown in FIG. 1A1, a film, for example, of As is deposited on the entire face including the inner face of the hole. Then, a resist film with a shape almost as shown in FIG. 2B is formed in the hole, and the As film is removed by etching with the resist film as a mask. After the As film is etched, the resist film is removed, and the As film remaining on the inner face of the hole, together with the semiconductor substrate 11, is heated to diffuse As atoms into the semiconductor substrate 11. Thus, the n-type region can be formed in a specific region of the semiconductor substrate 11 in advance.

As described above, in the embodiment shown in FIG. 1A1 to FIG. 4, the selective formation of the heat-treated $Al_2O_3$ film 13aa which becomes the capacitor insulating film in a predetermined position becomes possible from the difference in physical/chemical properties between the silicon film 14a as the mask and the resist film 15a as the mask for pattering the silicon film 14a. In particular, the characteristic point is that the property of the heat-treated $Al_2O_3$ film 13aa of usually being very difficult to etch is used (FIG. 2C to FIG. 3A).

Figure 5:
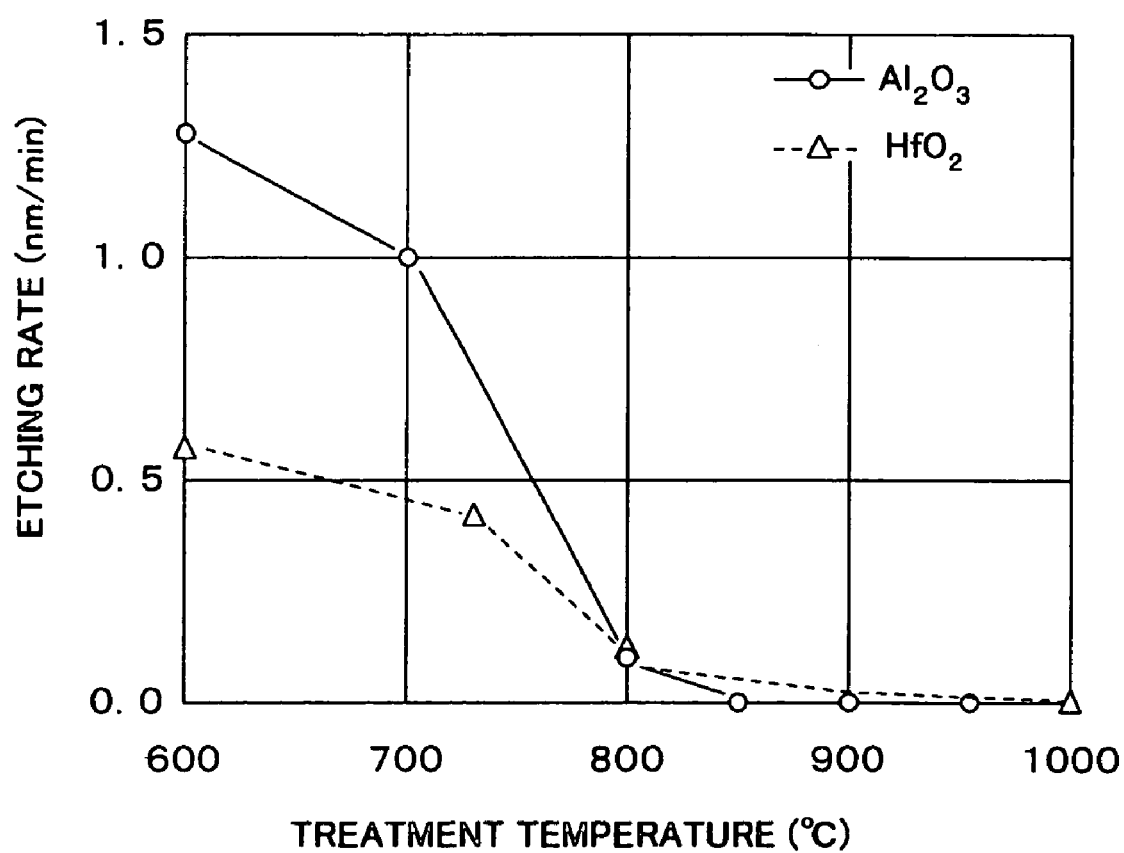
FIG. 5 is a diagram showing a data example in which how much an $Al_2O_3$ film is etched by a mixed solution of sulfuric acid (concentrated sulfuric acid) and hydrogen peroxide aqueous solution (=chemical for removing a resist film of a novolak resin) is measured according to the result of the heat treatment of the $Al_2O_3$ film explained in FIG. 1B.

FIG. 5 is a diagram showing a data example in which how much the $Al_2O_3$ film 13 is etched by the mixed solution of sulfuric acid (concentrated sulfuric acid) and hydrogen peroxide aqueous solution (=chemical for removing the resist film 15a of the novolak resin) is measured according to the result of the heat treatment of the $Al_2O_3$ film 13 explained in FIG. 1B. As shown by $Al_2O_3$ in FIG. 5, it turns out that the tendency of an etching rate greatly changes approximately at a treatment temperature of 800° C. Namely, the etching rate of the $Al_2O_3$ film after heat treatment at 800° C. is 0.08 nm per minute, and it is known that in this degree, even if 15 minute treatment time is required to remove the resist film 15a of the novolak resin, the $Al_2O_3$ film 13a is etched to a depth of only about 1.2 nm and most of its main portion remains. Conversely, it is conceivable that the $Al_2O_3$ film is fully crystallized by heat treatment at 800° C. or higher and thereby becomes a high-quality film with little possibility of generation of leakage current.

FIG. 5 also shows an example in which the $HfO_2$ film in addition to the $Al_2O_3$ film 13 is measured in the same manner. It can be seen from the result thereof that also the $HfO_2$ film has the property of being difficult to etch by the mixed solution of sulfuric acid (concentrated sulfuric acid) and hydrogen peroxide aqueous solution when heat-treated at 800° C. or higher. Accordingly, even if the $HfO_2$ film as another high dielectric constant film is formed in place of forming the $Al_2O_3$ film 13 (FIG. 1B) in the embodiment explained above, an integrated capacitor serving the same purpose can be almost similarly manufactured.

Alternatively, it is useful to form a two-layer stacked film, for example, of an $Al_2O_3$ film and a $HfO_2$ film or a three-layer stacked film, for example, of an $Al_2O_3$ film, a $HfO_2$ film, and an $Al_2O_3$ film in place of forming the single-layer $Al_2O_3$ film 13 such as shown in FIG. 1B. In the case of a multi-layer film, the $HfO_2$ film may be replaced with another dielectric film. In any case, the ALD method is useful in forming a plurality of very thin dielectric films.

Incidentally, the $Al_2O_3$ film 13 is heat-treated in the stage shown in FIG. 1B in the aforementioned embodiment, but it is possible to perform the heat treatment thereof in the stage shown in FIG. 1C.

Next, an embodiment different from the embodiment explained above will be described with reference to FIG. 6A1 to FIG. 9. FIG. 6A1 to FIG. 9 are process views showing a manufacturing method of an integrated capacitor according to another embodiment of the present invention in schematic longitudinal section (partly in top view). In these drawings, the same reference numerals and symbols are used to designate portions which are the same as or corresponding to the already explained portions. This embodiment is different from the aforementioned embodiment in that the $Al_2O_3$ film 13 which is the high dielectric constant film is heat-treated after it is formed selectively in a predetermined position. An explanation will be given below step by step.

Figure 6B:
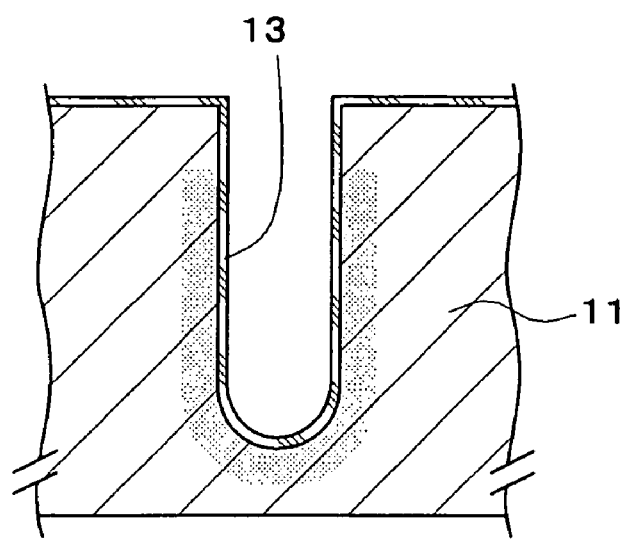
Figure 6C:
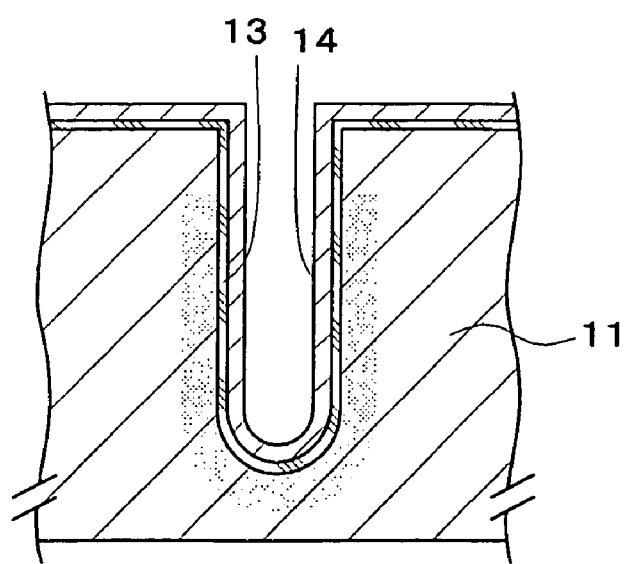
Figure 7A:
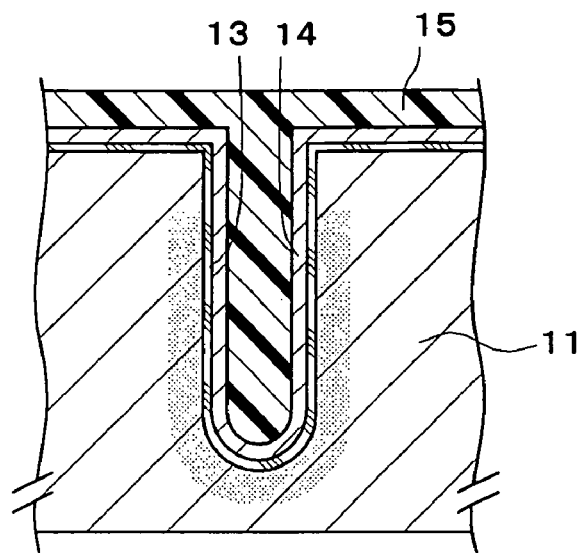
FIG. 7A, FIG. 7B, and FIG. 7C are process views subsequent to FIG. 6C, showing the manufacturing method of the integrated capacitor according to the other embodiment of the present invention in schematic longitudinal section.
Figure 7B:
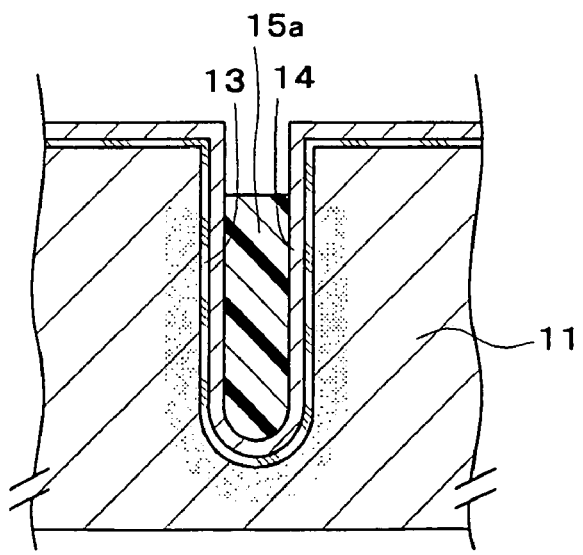

FIG. 6A1, FIG. 6A2, and FIG. 6B are the same as FIG. 1A1, FIG. 1A2, and FIG. 1B, respectively. However, in the stage shown in FIG. 6B, heat treatment to crystallize an $Al_2O_3$ film 13 is not performed. Then, as shown in FIG. 6C, a silicon film 14 is formed, which is almost the same as explained in FIG. 1C. Thereafter, as shown in FIG. 7A, a resist film 15 is formed, and as shown in FIG. 7B, the resist film 15 is processed to be shaped into a resist film 15a. These FIG. 7A and FIG. 7B are the same as explained in FIG. 2A and FIG. 2B, respectively.

Figure 7C:
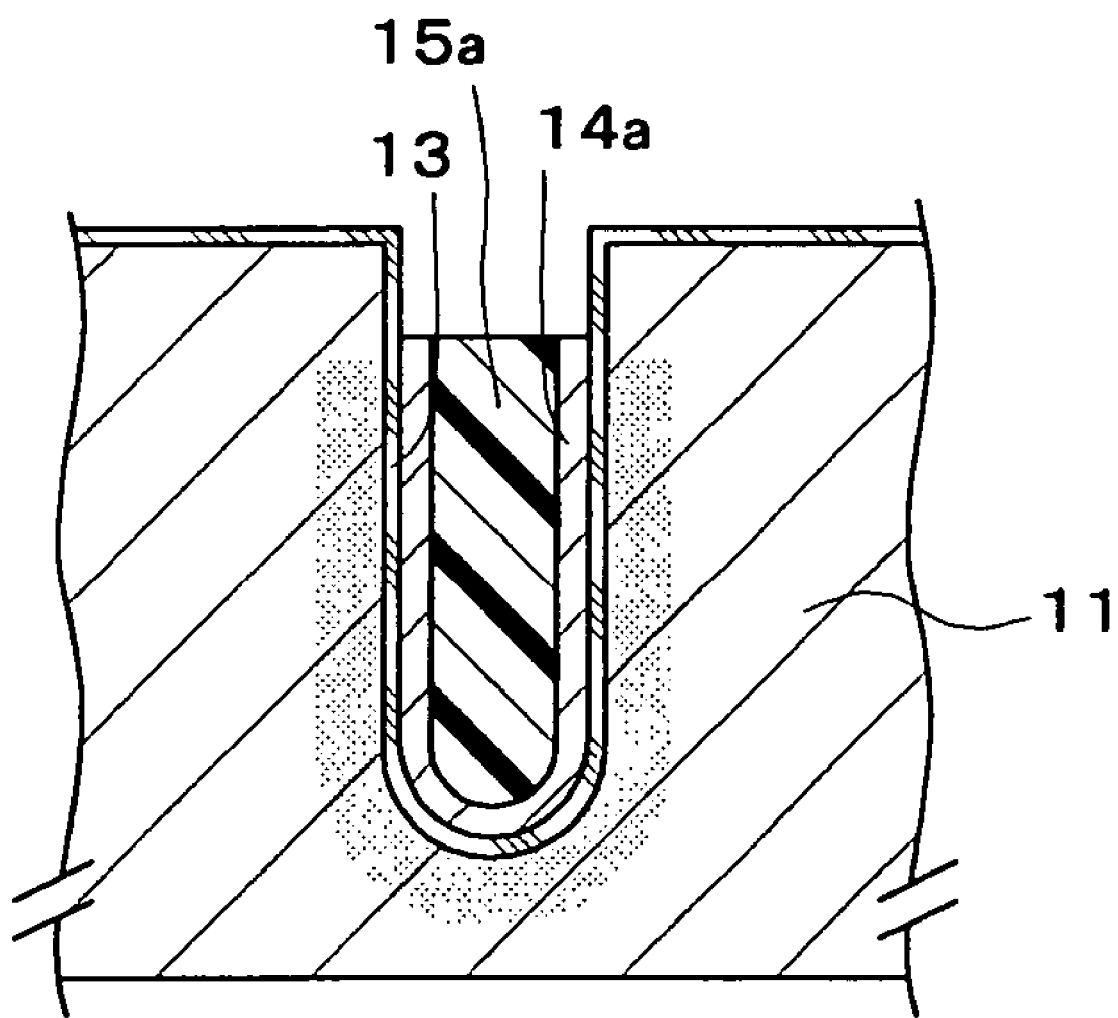
Figure 8A:
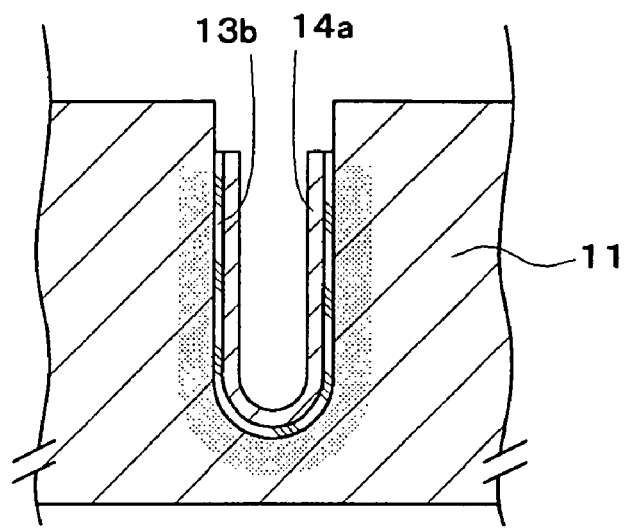
FIG. 8A, FIG. 8B, and FIG. 8C are process views subsequent to FIG. 7C, showing the manufacturing method of the integrated capacitor according to the other embodiment of the present invention in schematic longitudinal section.

Subsequently, as shown in FIG. 7C, the silicon film 14 is patterned with the processed resist film 15a as a mask to leave a silicon film 14a. This is the same as explained in FIG. 2C. Then, as shown in FIG. 8A, the resist film 15a is removed and simultaneously the $Al_2O_3$ film 13 is wet-etched with the silicon film 14a as a mask to leave an $Al_2O_3$ film 13b. Wet etching, for example, for 15 minutes, for example, with a mixed solution of sulfuric acid (concentrated sulfuric acid) and hydrogen peroxide aqueous solution as a chemical is applicable to the etching of these resist film 15a and $Al_2O_3$ film 13. In this wet etching, since the $Al_2O_3$ film 13 is not heat-treated, it is not crystallized and hence dissolves. Such simultaneous etching makes the process more efficient.

Figure 8B:
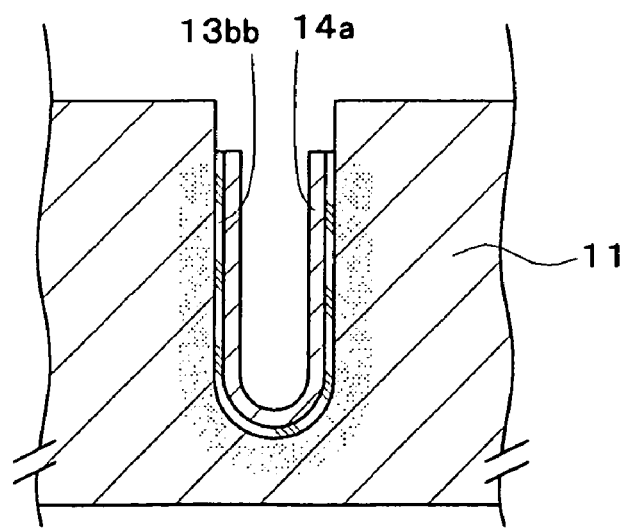

Then, as shown in FIG. 8B, the entire semiconductor substrate 11 is subjected to heat treatment (annealing) to crystallize the $Al_2O_3$ film 13b and reform it into a high-quality $Al_2O_3$ film 13bb with little possibility of generation of leakage current. The heat treatment is performed, for example, at 800° for approximately 30 minutes. This temperature is the same as explained in FIG. 5.

Figure 8C:
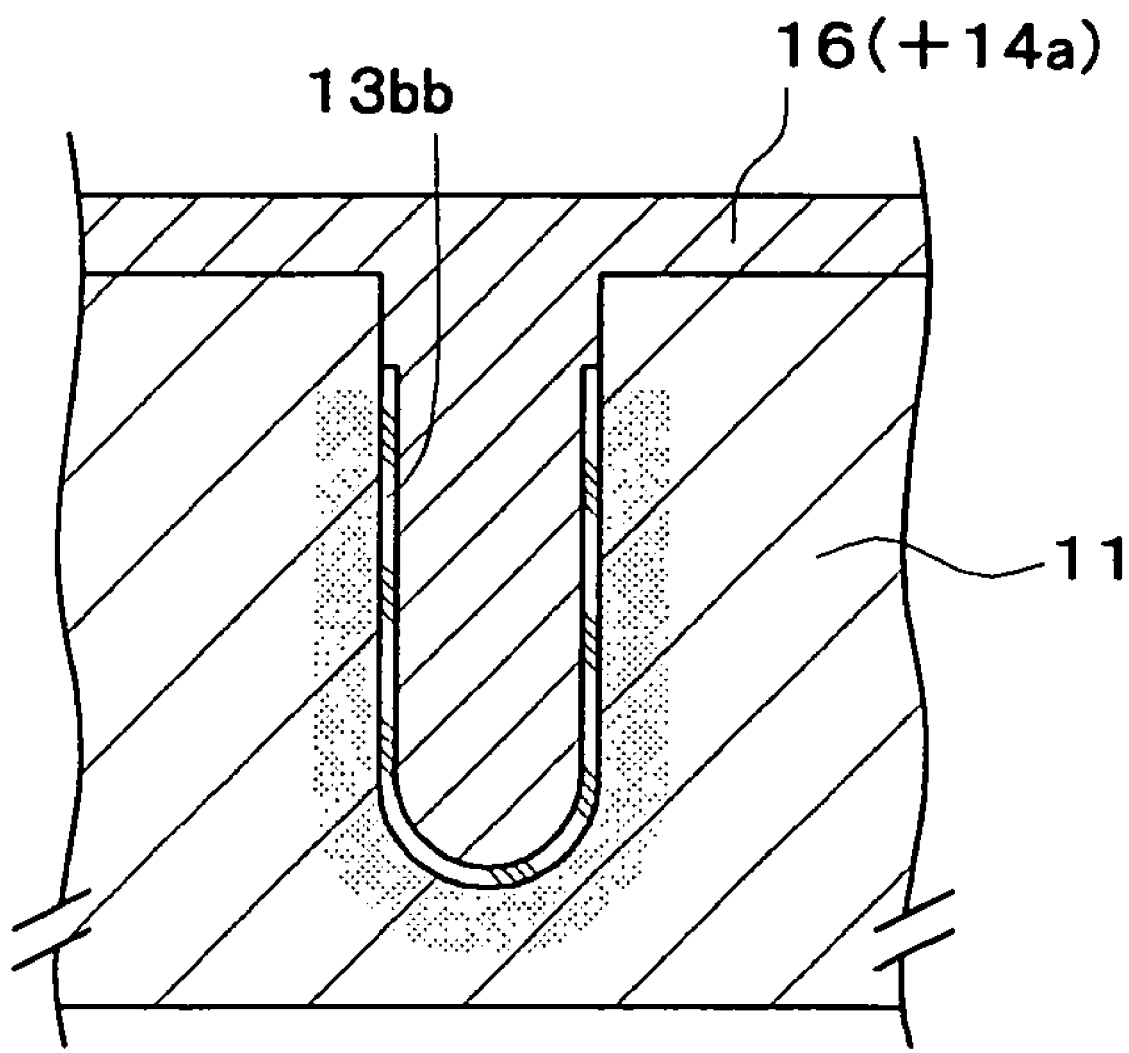

Thereafter, as shown in FIG. 8C, a silicon film 16 as an electrode material is formed to be embedded in the hole and formed on the entire face. This is the same as explained in FIG. 3C. Moreover, whether the silicon film 14a which has functioned as the mask is left as it is or removed is the same as explained in FIG. 3C. In relation to this, it is advantageous to perform the heat treatment of the $Al_2O_3$ film 13b at the stage shown in FIG. 8B after the silicon film 14a is removed. This can definitely avoid a p-type semiconductor from being formed in the electrode material.

Figure 9:
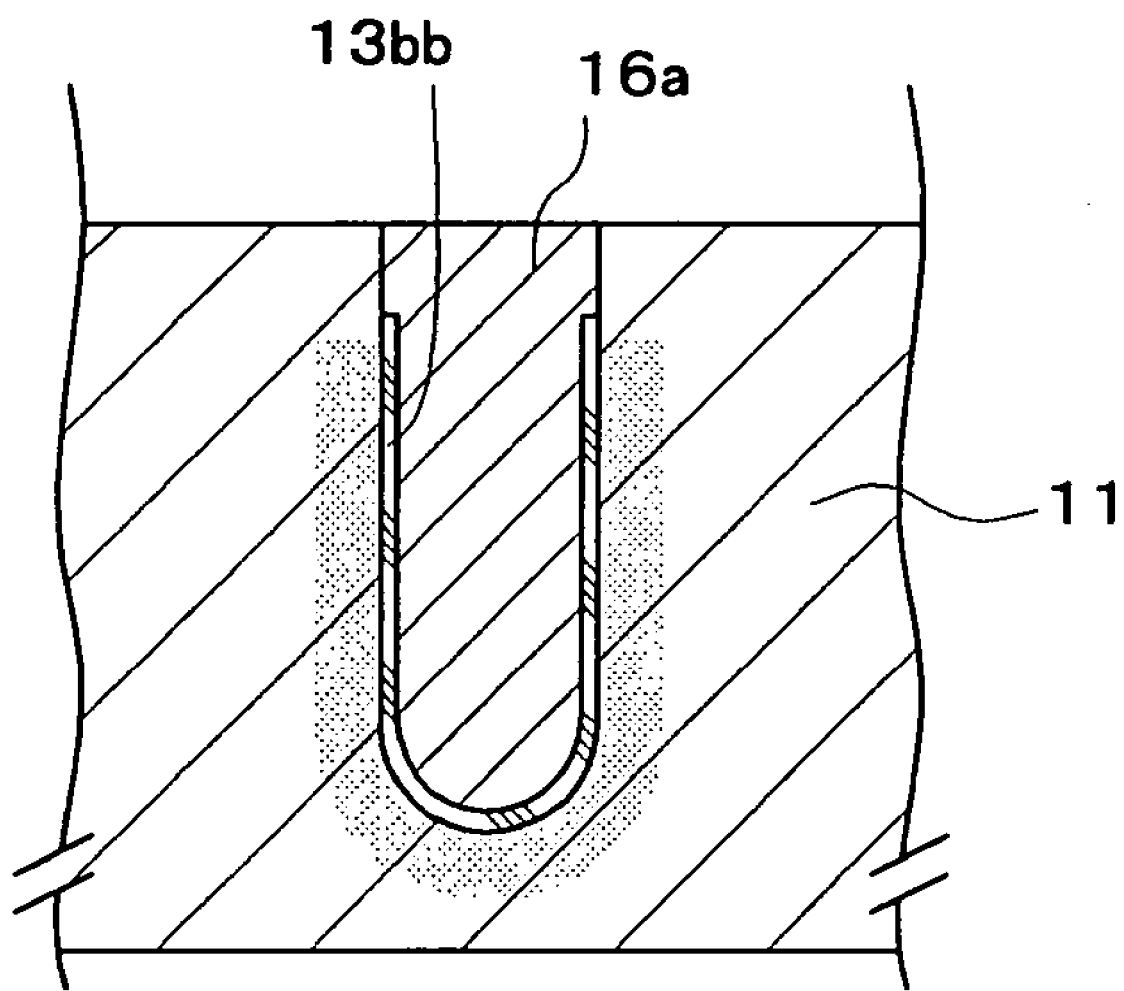
FIG. 9 is a process view subsequent to FIG. 8C, showing the manufacturing method of the integrated capacitor according to the other embodiment of the present invention in schematic longitudinal section.

After the silicon film 16 is formed, as shown in FIG. 9, the silicon film 16 which is deposited/formed on the semiconductor substrate 11 is removed by polishing so as to leave a silicon film 16a as the electrode material only in the hole. As a result, a structure as the integrated capacitor according to this embodiment can be obtained.

As explained above, in the embodiment shown in FIG. 6A1 to FIG. 9, the selective formation of the heat-treated $Al_2O_3$ film 13bb which becomes a capacitor insulating film in a predetermined position becomes possible from the existence of the difference in physical/chemical properties between the $Al_2O_3$ film 13b before the heat treatment and the silicon film 14a as the mask. In particular, the characteristic point is that the $Al_2O_3$ film 13 before the heat treatment is etched simultaneously with the resist film 15a, resulting in increased efficiency.

Also in this embodiment, it is useful to form a two-layer stacked film, for example, of an $Al_{203}$ film and a $HfO_2$ film or a three-layer stacked film, for example, of an $Al_2O_3$ film, a $HfO_2$ film and an $Al_2O_3$ film in place of forming the single-layer $Al_2O_3$ film 13.

It should be understood that the present invention is not limited to the specific aspects described above with illustration and all the changes which come within the range of equivalency of the following claims are therefore intended to be embraced therein.

What is claimed is:

1. A manufacturing method of an integrated capacitor, comprising:
   forming a hole in a semiconductor substrate;
   depositing a dielectric film on an inner face of the formed hole;
   heat-treating the deposited dielectric film;
   depositing a silicon film on the dielectric film;
   embedding a resist film into the hole except an upper portion of the inner face of the hole on which the dielectric film and the silicon film are deposited;
   etching the silicon film on the heat-treated dielectric film with the embedded resist film as a mask;
   removing the resist film;
   removing the heat-treated dielectric film by etching with the silicon film remaining after the etching as a mask; and
   embedding an electrode material into the hole having the dielectric film remaining after the removal by etching.

2. A manufacturing method of an integrated capacitor as set forth in claim 1, wherein in the depositing the silicon film on the dielectric film, a polycrystalline silicon film or an amorphous silicon film is deposited as the silicon film.

3. A manufacturing method of an integrated capacitor as set forth in claim 1, wherein
   in the embedding the resist film in the hole except the upper portion of the inner face of the hole on which the dielectric film and the silicon film are deposited, a novolak resin is used as the resist film, and
   in the removing the resist film, the resist film is removed using a mixed solution of sulfuric acid and hydrogen peroxide aqueous solution.

4. A manufacturing method of an integrated capacitor as set forth in claim 1, wherein in the depositing the dielectric film on the inner face of the formed hole, an $Al_2O_3$ film is used as the dielectric film and deposited by an ALD method.

5. A manufacturing method of an integrated capacitor as set forth in claim 4, wherein the heat-treating the deposited dielectric film is performed at a temperature of 800° C. or higher.

6. A manufacturing method of an integrated capacitor as set forth in claim 1, wherein in the depositing the dielectric film on the inner face of the formed hole, as the dielectric film, a stacked film of an $Al_2O_3$ film and a dielectric film other than the $Al_2O_3$ film is deposited.

7. A manufacturing method of an integrated capacitor as set forth in claim 1, wherein the removing the heat-treated dielectric film by etching with the silicon film remaining after the etching as the mask, heated phosphoric acid is used as a chemical for the removal by etching.

8. A manufacturing method of an integrated capacitor as set forth in claim 1, wherein the silicon film remaining after the etching is left as a part of the electrode material to be embedded in the hole.

9. A manufacturing method of an integrated capacitor, comprising:
   forming a hole in a semiconductor substrate;
   depositing a dielectric film on an inner face of the formed hole;
   depositing a silicon film on the deposited dielectric film;
   embedding a resist film into the hole except an upper portion of the inner face of the hole on which the dielectric film and the silicon film are deposited;
   etching the silicon film on the deposited dielectric film with the embedded resist film as a mask;
   removing the resist film, and removing the deposited dielectric film by etching with the silicon film remaining after the etching as a mask;
   heat-treating the dielectric film remaining after the removal by etching; and
   embedding an electrode material into the hole having the dielectric film remaining after the removal by etching.

10. A manufacturing method of an integrated capacitor as set forth in claim 9, wherein in the depositing the silicon film on the deposited dielectric film, a polycrystalline silicon film or an amorphous silicon film is deposited as the silicon film.

11. A manufacturing method of an integrated capacitor as set forth in claim 9, wherein
    in the embedding the resist film in the hole except the upper portion of the inner face of the hole on which the dielectric film and the silicon film are deposited, a novolak resin is used as the resist film, and
    in the removing the resist film and removing the deposited dielectric film by etching with the silicon film remaining after the etching as the mask, the resist film is removed using a mixed solution of sulfuric acid and hydrogen peroxide aqueous solution, and the deposited dielectric film is removed by etching with the silicon film remaining after the etching as the mask.

12. A manufacturing method of an integrated capacitor as set forth in claim 9, wherein in the depositing the dielectric film on the inner face of the formed hole, an $Al_2O_3$ film is used as the dielectric film and deposited by an ALD method.

13. A manufacturing method of an integrated capacitor as set forth in claim 12, wherein the heat-treating the dielectric film remaining after the removal by etching is performed at a temperature of 800° C. or higher.

14. A manufacturing method of an integrated capacitor as set forth in claim 9, wherein in the depositing the dielectric film on the inner face of the formed hole, as the dielectric film, a stacked film of an $Al_2O_3$ film and a dielectric film other than the $Al_2O_3$ film is deposited.

15. A manufacturing method of an integrated capacitor as set forth in claim 14, wherein the dielectric film other than the $Al_2O_3$ film is a $HfO_2$ film.

16. A manufacturing method of an integrated capacitor as set forth in claim 9, wherein the silicon film remaining after the etching is left as a part of the electrode material to be embedded in the hole.

* * * * *